United States Patent [19]
Takemoto

[11] Patent Number: 5,438,208
[45] Date of Patent: Aug. 1, 1995

[54] MIRROR COUPLED MONOLITHIC LASER DIODE AND PHOTODETECTOR

[75] Inventor: Akira Takemoto, Itami, Japan

[73] Assignee: Mitsubishi Denki Kabushiki Kaisha, Tokyo, Japan

[21] Appl. No.: 140,502

[22] Filed: Oct. 25, 1993

[30] Foreign Application Priority Data

Jan. 27, 1993 [JP] Japan .................. 5-011586

[51] Int. Cl.⁶ .................................. G02B 27/00
[52] U.S. Cl. .......................... 250/551; 257/82
[58] Field of Search ............. 250/551; 257/80, 81, 257/82; 307/311

[56] References Cited

U.S. PATENT DOCUMENTS

| | | | |
|---|---|---|---|
| 4,124,860 | 11/1978 | Johnson | 357/19 |
| 4,730,330 | 3/1988 | Plihal et al. | 372/50 |
| 4,733,094 | 3/1988 | Carpentier et al. | 357/19 |
| 4,945,391 | 7/1990 | Yagoura et al. | 357/19 |
| 5,256,869 | 10/1993 | Lin et al. | 250/201.9 |
| 5,258,991 | 11/1993 | Peterson | 372/50 |

FOREIGN PATENT DOCUMENTS

| | | |
|---|---|---|
| 0493051 | 7/1992 | European Pat. Off. . |
| 61-235810 | 10/1986 | Japan . |
| 62-225067 | 10/1987 | Japan . |
| 63-36216 | 2/1988 | Japan . |
| 1155674 | 6/1989 | Japan . |
| 1234813 | 9/1989 | Japan . |
| 1248143 | 10/1989 | Japan . |
| 228987 | 1/1990 | Japan . |
| 286180 | 3/1990 | Japan . |
| 2118612 | 5/1990 | Japan . |
| 2166416 | 6/1990 | Japan . |
| 3132712 | 6/1991 | Japan . |
| 3144922 | 6/1991 | Japan . |
| 499082 | 3/1992 | Japan . |
| 4161919 | 6/1992 | Japan . |
| 92/16021 | 9/1992 | WIPO . |

OTHER PUBLICATIONS

"Transactions of the Japan Society of Applied Physics", 1986 p. 173.

*Primary Examiner*—David C. Nelms
*Assistant Examiner*—Steven L. Nichols
*Attorney, Agent, or Firm*—Leydig, Voit & Mayer

[57] ABSTRACT

An optical integrated circuit includes a laser diode emitting laser light and a photodiode detecting light emitted from the laser diode on the same semiconductor substrate but not colinear and a mirror optically coupling the laser diode with the photodiode. The axes of the laser diode and the photodiode are parallel. The mirror is parallel to a laser light emitting facet of the laser diode to couple the laser diode and the photodiode. Resonator facets of the laser diode are produced by cleaving, not etching, whereby an optical integrated circuit including a laser diode having high performance and high reliability is obtained.

13 Claims, 5 Drawing Sheets

MIRROR COUPLED MONOLITHIC LASER DIODE AND PHOTODETECTOR

FIELD OF THE INVENTION

The present invention relates to an optical integrated circuit comprising a laser diode and a photodiode.

BACKGROUND OF THE INVENTION

FIG. 10 is a cross-sectional view illustrating a prior art optical integrated circuit comprising a laser diode and a photodiode disclosed in, transactions of The Japan Society of Applied Physics, autumn, 1986, P. 178, 29a-T-5. In the figure, reference numeral 1 designates a first conductivity type, for example, n type, InP semiconductor substrate having a thickness of 100 μm and a carrier concentration of $5.0 \times 10^{18}$ cm$^{-3}$. Reference numerals 1a and 1b designate n type InP semiconductor layers serving as lower cladding layers having a thickness of 1 μm, and a carrier concentration of $1.0 \times 10^{18}$ cm$^{-3}$ disposed on the semiconductor substrate 1. Reference numerals 2a and 2b designate undoped In$_{1-x}$Ga$_x$As$_y$P$_{1-y}$ semiconductor layers serving as active layers having a thickness of 0.1 μm, and an energy band gap narrower than that of the n type semiconductor lower cladding layers 1a and 1b. The undoped semiconductor layers 2a and 2b are disposed on the n type InP semiconductor lower cladding layers 1a and 1b. Reference numerals 3a and 3b designate p type InP semiconductor layers serving as upper cladding layers, having a thickness of 1.0 μm and a carrier concentration of $1.0 \times 10^{18}$ cm$^{-3}$. The energy band gaps of the layers 3a and 3b are larger than those of the semiconductor layers 2a and 2b and these layers are disposed on the semiconductor layers 2a and 2b, respectively. Reference numeral 4 designates an etched groove penetrating through the semiconductor layers 1, 2, 3 and reaching the semiconductor substrate 1. The etched groove 4 has a depth of 3 μm and the minimum width of 5 μm at the lowermost part of the groove and the maximum width of 10 μm at the uppermost part of the groove. Reference numeral 5 designates a laser diode comprising the semiconductor layers 1a, 2a, 3a and the substrate 1. Reference numeral 6 designates a photodiode comprising the semiconductor layers 1b, 2b, 3b and the semiconductor substrate 1. Reference numeral 12c designates a common n side electrode disposed on the n type semiconductor substrate 1. Reference numeral 2a designates a p side electrode for the laser diode disposed on the p type upper cladding layer 3a. Reference numeral 12b designates a p side electrode for the photodiode disposed on the p type upper cladding layer 3b. One of the side surfaces of the groove 4 at the side of the laser diode 5 is perpendicular to the substrate to form a resonator facet and the other surface at the side of the photodiode 6 is oblique to reflect part of the laser light L emitted from the laser diode which does not enter the photodiode 6 in an upward direction. Therefore, the laser light L, which is emitted from the laser diode 5 and then reflected by the obliquely inclined surface of the photodiode 6, does not again enter into the photodiode 6.

Next, an operation will be described.

When a forward voltage is applied between the electrode 12c at the side of the n type semiconductor substrate 1 and the electrode 12a at the side of p type semiconductor layer 3a for the laser diode 5, electrons and holes as carriers are injected into the semiconductor layer 2a serving as an active layer having a narrower energy band gap than those of the lower and upper cladding layers 1a and 3a, and light having a wavelength corresponding to that energy band gap is generated in the active layer 2a. This light is amplified by being repeatedly reflected at the resonator facets 5a and 5b at the right and left sides of the laser diode 5, and a laser oscillation occurs to generate laser light. Most of the laser light is emitted from the resonator facet 5b shown at the left side of FIG. 10 and the laser light L other than that is emitted as monitor light from the resonator facet 5a shown at the right side of the figure. The light L emitted from the resonator facet 5a as the monitor light is absorbed in the semiconductor layer 2b in the photodiode 6, having the same narrow energy band gap as the semiconductor layer 2a and narrower than those of the lower and upper cladding layers 1b and 3b, and electrons and holes are generated in the semiconductor layer 2b of the photodiode 6. At this time, when a reverse direction voltage is applied between the n type semiconductor substrate 1 and the p type semiconductor layer 3b, a current on proportion to the intensity of the light which is incident on the photodiode 6 is detected, and the light intensity of the laser diode 5 is thus monitored.

Next, a method for producing the device of FIG. 10 will be described. First of all, the InP, InGaAsP, and InP semiconductor layers 1, 2, and 3 are successively formed on the n type InP semiconductor substrate 1 by, for example, MOCVD (Metal Organic Chemical Vapor Deposition). Then, the etched groove 4 is formed by, for example, RIE (Reactive Ion Etching) employing chlorine (Cl$_2$) gas. Here, the etched surface 5a at the side of the laser diode 5 is required to be smooth and perpendicular to the semiconductor substrate 1. This is because this etched surface 5a constitutes a resonator of the laser diode 5 with the facet 5b of the laser diode 5 shown at left side of FIG. 10, and this resonator of the laser diode 5 is required to ensure a stable laser oscillation.

In this prior art optical integrated circuit having a structure as described above, in order to attain an improved characteristic of the laser diode, the etched surface is required to be perpendicular to the semiconductor substrate 1 and also smooth. However, there are problems as in the following. Although when a prior art laser diode is produced separately, good quality resonator facets can be produced by cleaving, when the prior art optical integrated circuit having a photodiode together with a laser diode as shown in FIG. 10 is manufactured, etching has to be carried out to produce the groove between the laser diode and the photodiode which also constitutes a resonator facet. This has resulted in great difficulty in obtaining a good quality etched surface by a conventional etching technique. In other words, when etching is carried the crystal at the etched surface is damaged and the reliability of the laser diode is deteriorated. Thus, the improved characteristic of the laser diode cannot be expected in the optical integrated circuit of the above-described structure.

SUMMARY OF THE INVENTION

It is an object of the present invention to provide an optical integrated circuit including a laser diode and a photodiode that requires no etching in producing a resonator facet of the laser diode.

Another object of the present invention is to provide an optical integrated circuit of the above-described structure having high performance and long-term reliability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

According to a first aspect of the present invention, an optical integrated circuit includes a laser diode and a photodiode arranged at different positions on the same semiconductor substrate. Those positions are not optically on the same straight line, and a reflecting mirror optically coupling the laser diode with the photodiode is arranged on a supporting plate on which the laser diode and the photodiode with the same semiconductor substrate are disposed.

According to a second aspect of the present invention, the laser diode and the photodiode are arranged so that their optical axes are parallel to each other by producing them in the same production process, and the reflecting mirror is employed to optically couple the laser diode and the photodiode so that the light emitted from the laser diode is reflected and enters the photodiode.

Therefore, the resonator facet of the laser diode can be produced by cleavage without etching and an optical integrated circuit including a laser diode having high performance and high reliability is obtained.

DETAILED DESCRIPTION OF THE PREFERRED EMBODIMENT

Embodiment 1

Figure 1:
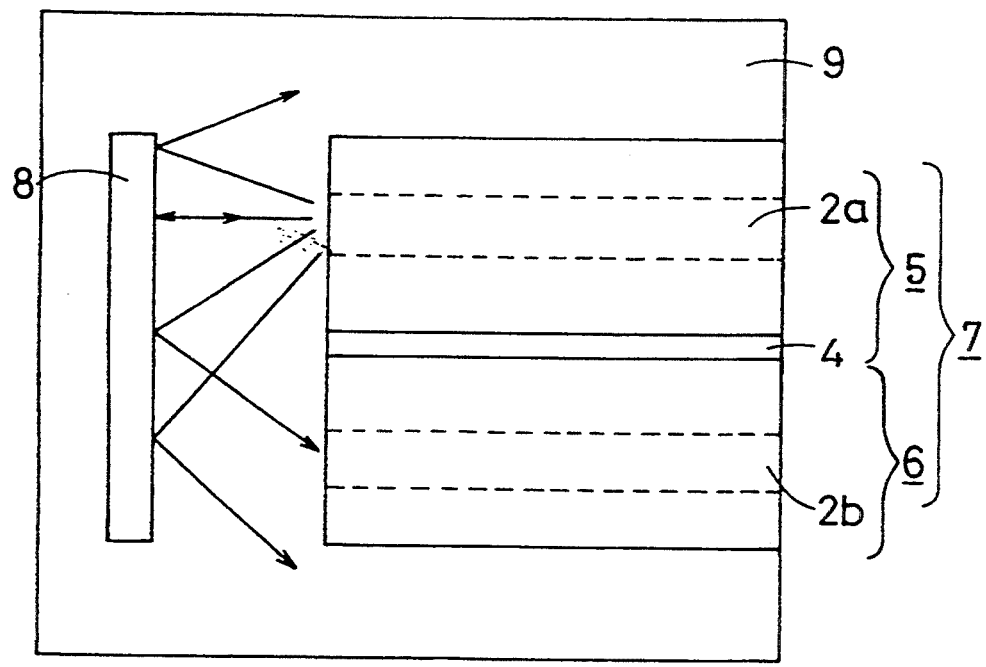
FIG. 1(a) is a plan view showing an optical integrated circuit in accordance with a first embodiment of the present invention and FIG. 1(b) is a cross-sectional view of the optical integrated circuit element.
Figure 1:
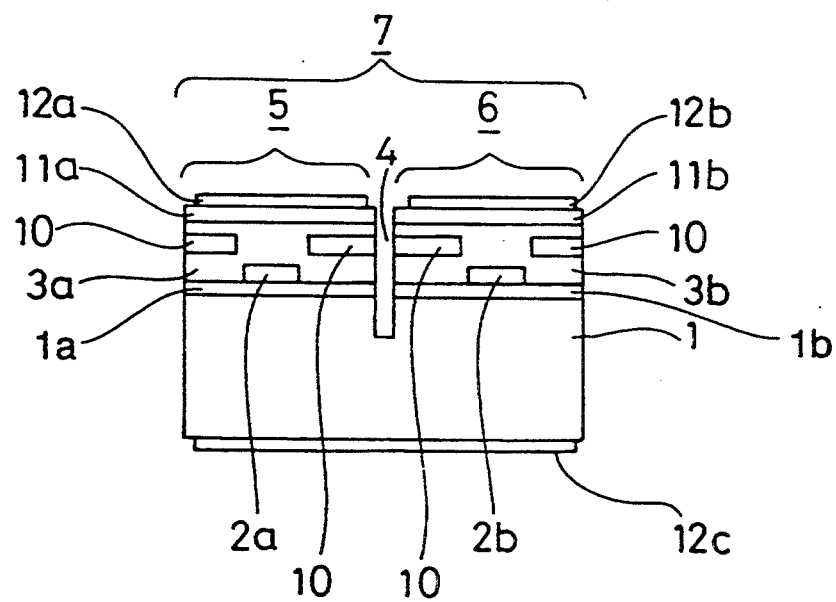

A first embodiment of the present invention will be described with reference to FIGS. 1(a) and 1(b) hereinafter. FIG. 1(a) is a plan view of an optical integrated circuit in accordance with a first embodiment of the present invention and FIG. 1(b) is a cross-sectional view of that optical integrated circuit element. In these figures, reference numeral 1 designates a first conductivity type, for example, n type InP semiconductor substrate having a thickness of 100 $\mu$m and a carrier concentration of $5.0 \times 10^{18}$ cm$^{-3}$. Reference numerals 1a and 1b designate n type InP semiconductor layers as lower cladding layers having a thickness of 1 $\mu$m and a carrier concentration of $1.0 \times 10^{18}$ cm$^{-3}$ disposed on the semiconductor substrate 1. Reference numerals 2a and 2b designate undoped $In_{1-x}Ga_xAs_yP_{1-y}$ semiconductor layers serving as active layers having a thickness of 0.1 $\mu$m, and an energy band gap narrower than that of the n type semiconductor lower cladding layers 1a and 1b. Reference numerals 3a and 3b designate second conductivity type, for example, p type, InP semiconductor layers serving as upper cladding layers having a thickness of 1.0 $\mu$m, a carrier concentration of $1.0 \times 10^{18}$ cm$^{-3}$, and an energy band Gap larger than those of the undoped semiconductor active layers 2a and 2b. Reference numeral 10 designates n type InP current blocking layers for controlling the flow of a current through the active layer with high efficiency that are disposed in the semiconductor layers 3a and 3b. Reference numerals 11a and 11b designate p type InP contact layers, respectively formed on the upper cladding layers 3a and 3b. Reference numeral 12c designates an n side electrode disposed on the rear surface of the n type InP substrate 1, and reference numerals 12a and 12b designate p side electrodes for the laser diode and the photodiode, respectively disposed on the p type contact layers 11a and 11b.

In addition, reference numeral 4 designates an etched Groove penetrating through the semiconductor layers 1, 2, 3, 10, 11 and reaching the semiconductor substrate 1. Reference numeral 5 designates a laser diode comprising the semiconductor substrate 1 and the semiconductor layers 1a, 2a, 3a, 10, 11 and reference numeral 6 designates a photodiode comprising the semiconductor substrate 1 and the semiconductor layers 1b, 2b, 3b, 10, 11. The axes of the laser diode 5 and the photodiode 6 are parallel to each other and an optical integrated circuit element 7 comprises the laser diode 5 and the photodiode 6. Reference numeral 8 designates a reflecting mirror provided for reflecting laser light emitted from the laser diode 5, into the photodiode 6. Reference numeral 9 designates a supporting plate comprising, for example, silicon, ceramic, a metal such as copper, a metal alloy such as stainless steel, or the like on which the optical integrated element 7 and the reflecting mirror 8 are mounted.

Next, an operation will be described. When a forward direction voltage is applied between the n type semiconductor substrate 1 and the p type semiconductor layer 3a at the side of the laser diode 5 from the both electrodes 12a and 12c, a current flows through the semiconductor layer 3a and the semiconductor substrate 1 with the current path controlled by the current blocking layers 10, whereby electrons and holes as carriers are injected into the semiconductor layer 2a serving as an active layer having a narrow energy band gap, and light having a wavelength corresponding to that energy band gap is generated in the semiconductor layer 2a. This light is amplified by being repeatedly reflected at the left and right resonator facets of the laser diode 5 and laser oscillation occurs to emit laser light. The laser light is reflected at the ends of the semiconductor layer 2a and parts of the laser light are emitted to the outside. The light emitted from one end is utilized as an output light of a light signal by employing, for example, an optical fiber or the like. On the other hand, the light L emitted from the other end is reflected by the reflecting mirror 8, and a part of the light is absorbed in that semiconductor layer 2b in the photodiode 6 and is detected as an optical current. Thus, the intensity of the laser light is monitored by using this optical current.

Next, a method for producing the laser diode and the photodiode of this embodiment will be described. Initially, the n type InP and InGaAsP semiconductor layers 1 and 2 are grown on the n type InP semiconductor substrate 1 by, for example, MOCVD, and required parts of the semiconductor layer 2 are etched and removed employing photolithography. Thereafter, the p type InP semiconductor layer 3 having an energy band gap larger than that of the undoped InGaAsP semiconductor layer 2 serving as an active layer is grown on the undoped InGaAsP semiconductor layer 2 by MOCVD. Further, after removing portions of the semiconductor layer 2 by etching, the n type current blocking layers 10 are grown by MOCVD, and further the semiconductor layer 3 is successively grown thereon, followed by growing of a p type contact layer 11.

Then, an etched groove 4 is produced by etching to the semiconductor layers 11, 10, 3, 2, and 1 until reaching the semiconductor substrate 1 by, for example, RIE employing chlorine ($Cl_2$) gas, or wet etching employing such as bromomethanol ($Br—CH_3OH$) etchant, whereby the laser diode 5 and the photodiode 6 are electrically separated.

Then, the whole semiconductor substrate 1, on which a plurality of elements are formed, is cleaved in a direction perpendicular to the etched groove 4 to form laser facets, and thereafter, the elements are separated from each other by being cut in a direction parallel to the etched groove 4, thereby producing an optical integrated circuit element 7. Then, the optical integrated circuit element 7 and the reflecting mirror 8 are disposed on the supporting plate 9 comprising such as silicon so that the laser light emitting facet of the laser diode 5 and the reflecting mirror 8 are parallel to each other, whereby the optical integrated circuit of this embodiment is obtained.

In this embodiment, the optical axes of the laser diode 5 and the photodiode 6 are arranged in parallel with each other on the same semiconductor substrate 1 by being produced by the same production process, and the laser light L emitted from the laser diode 5 is reflected by the reflecting mirror 8 which is disposed on the supporting plate 9 on which the laser diode 5 and the photodiode 6 with the common semiconductor substrate 1 is mounted, so that the reflected light is incident to the photodiode 6. Therefore, the resonator facet of the laser diode is produced by cleaving without employing etching, whereby an optical integrated circuit including a laser diode 5 and a photodiode having high performance and high reliability is obtained.

There are conventionally a plurality of optical integrated circuits in which optical coupling between a laser diode and a photodiode, which are not produced on the same semiconductor substrate, is carried out by a reflecting mirror provided externally to the laser diode and the photodiode. In such a case where a laser diode and a photodiode are not produced on the same semiconductor substrate, optical coupling can be achieved without employing a reflecting mirror because both can be arbitrarily arranged. However, when both the laser and photodiode are arranged on the same semiconductor substrate, great difficulty is involved in attaining the optical coupling in view of manufacturing and optical restrictions. The present invention realizes optical coupling between a laser diode and a photodiode, which are produced on the same semiconductor substrate, easily by employing a reflecting mirror, and thus provides a large advantages over these prior art structures.

Embodiment 2

Figure 2:
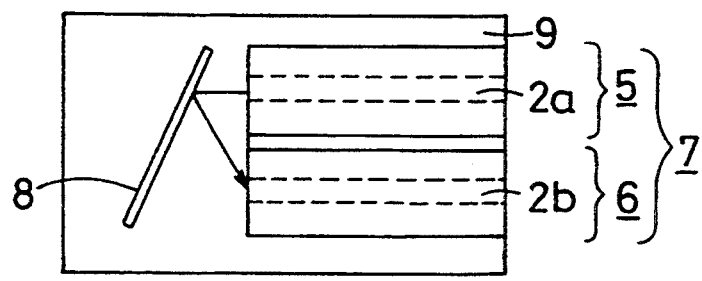
FIG. 2 is a plan view of an optical integrated circuit in accordance with a second embodiment of the present invention.

In the above-described first embodiment, the laser light emitting facet of the laser diode 5 of the optical integrated circuit element 7 is arranged parallel to the reflecting mirror 8. In a second embodiment shown in FIG. 2, the reflecting mirror 8 is disposed obliquely in order to increase the efficiency of optical coupling of the laser light emitted from the laser diode 5 with the photodiode 6, i.e., to efficiently couple the laser light L emitted from the laser diode 5 to the photodiode 6.

Embodiment 3

Figure 3:
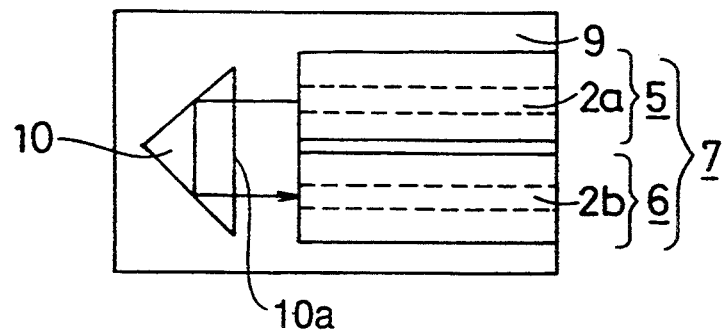
FIG. 3 is a plan view of an optical integrated circuit in accordance with a third embodiment of the present invention.

While in the above-described first embodiment, a plane mirror is employed as the reflecting mirror 8, in a third embodiment shown in FIG. 3, a corner cube prism 10 is employed. The corner cube prism 10 is disposed such that one side surface thereof is parallel to the laser light emitting facet of the laser diode 5 and the output light is output parallel to the laser light emitted from the laser diode 5 as an input light, thereby forming an optical integrated circuit.

Embodiment 4

Figure 4:
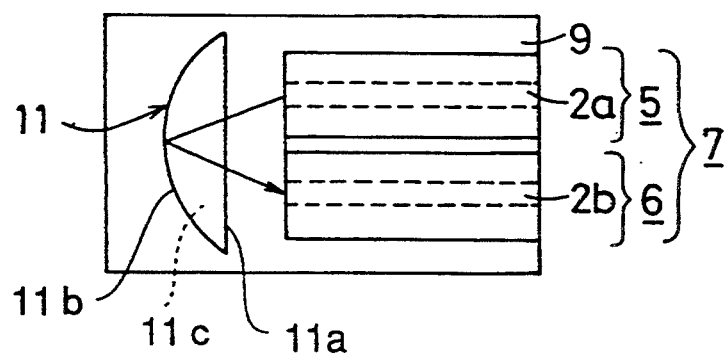
FIG. 4 is a plan view of an optical integrated circuit in accordance with a fourth embodiment of the present invention.

While in the above-described first embodiment a plane mirror is employed as the reflecting mirror 8, in a fourth embodiment shown in FIG. 4, a spherical mirror 11 having a plane surface and a portion of spherical surface is employed. The lower part of the spherical mirror 11 which has a plane surface 11a and a part of a spherical surface 11b is cut at a surface 11c which is perpendicular to the plane surface 11a and the spherical mirror 11 is disposed on the supporting plate 9 with the horizontal surface 11c in contact with the upper surface of the supporting plate 9. Then, the spherical mirror 11 is disposed so that the plane surface 11a may be parallel to the laser light emitting facet of the laser diode 5, thereby forming an optical integrated circuit 7.

Embodiment 5

Figure 5:
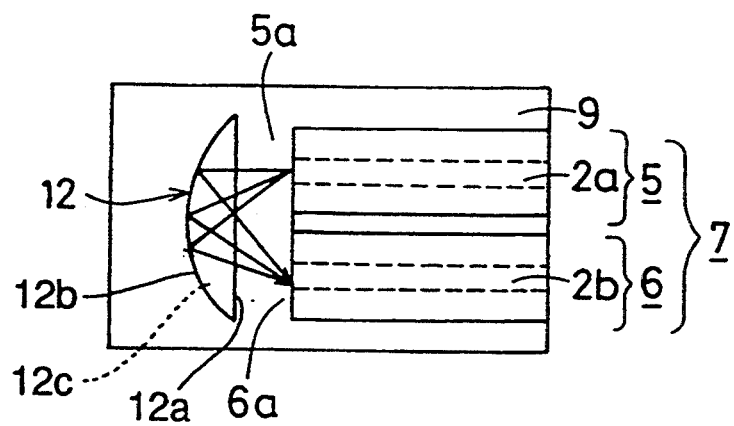
FIG. 5 is a plan view of an optical integrated circuit in accordance with a fifth embodiment of the present invention.

While in the above-described first embodiment a plane mirror is employed as the reflecting mirror 8, in a fifth embodiment shown in FIG. 5, an ellipsoidal mirror of revolution 12, which has focal points at the light emission point of the laser light emitting facet 5a of the laser diode 5 and the light receiving point of the laser light receiving facet 6a of the photodiode 6, is employed. The ellipsoidal mirror of revolution 12 having a plane surface 12a and a surface of a portion of an ellipsoid of revolution 12b has its lower part cut at a surface 12c perpendicular to the plane surface 12a and the ellipsoidal mirror of revolution 12 is disposed on the supporting plate 9 with the horizontal surface 12c in contact with the upper surface of the supporting plate 9. Then, it is disposed with the plane surface 12 positioned parallel to the laser light emitting facet of the laser diode 5, thereby forming an optical integrated circuit 7.

Embodiment 6

Figure 6:
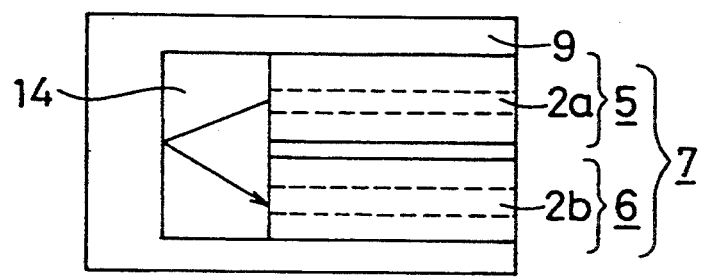
FIG. 6 is a plan view of an optical integrated circuit in accordance with a sixth embodiment of the present invention.

In the above-described first embodiment, the reflecting mirror 8 is fixed on the supporting plate 9. However, in a sixth embodiment shown in FIG. 6, in order to avoid influences of the thermally expanding supporting plate 9, a rectangular-parallelepiped reflecting mirror 14 is fixed by being adhered to the facet of the optical integrated circuit element 7.

Embodiment 7

Figure 7:
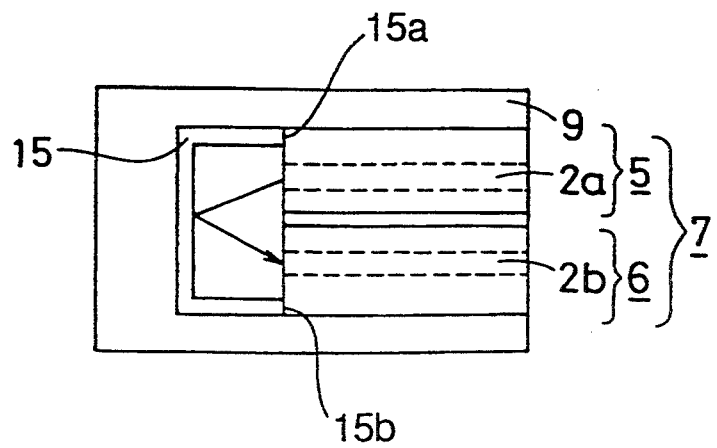
FIG. 7 is a plan view of an optical integrated circuit in accordance with a seventh embodiment of the present invention.

In the above-described sixth embodiment, reflection of light on the contact surface between the reflecting mirror 14 and the facet of the optical integrated circuit element 7 may affect the characteristic of the laser diode 5. In a seventh embodiment shown in FIG. 7, a reflecting mirror 15 having a side surface in a U-shaped configuration is fixed to the optical integrated circuit element 7 by adhering both end portions 15a and 15b of the U-shaped configuration to the facets of the laser diode and the photodiode, respectively.

Embodiment 8

Figure 8:
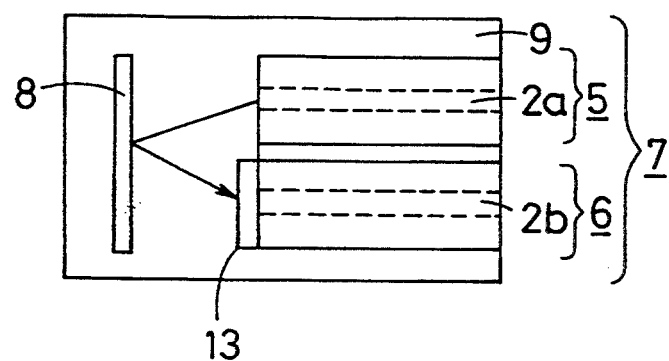
FIG. 8 is a plan view of an optical integrated circuit in accordance with an eighth embodiment of the present invention.

In the above-described first to seventh embodiments, no coating is applied to the light receiving facet of the photodiode 6 of the optical integrated circuit element 7. In these structures, when a part of the light L emitted from the laser diode 5 and reflected by the reflecting mirror 8, and at the light receiving facet of the photodiode 6 without entering the photodiode, and is again incident on the laser diode 5, the characteristic of the laser diode 5 may be affected. In an eighth embodiment shown in FIG. 8, in order to avoid this, the facet of the photodiode 6 is coated with a low reflectivity film 13. This construction may also be applied to the second to seventh embodiments.

Embodiment 9

Figure 9:
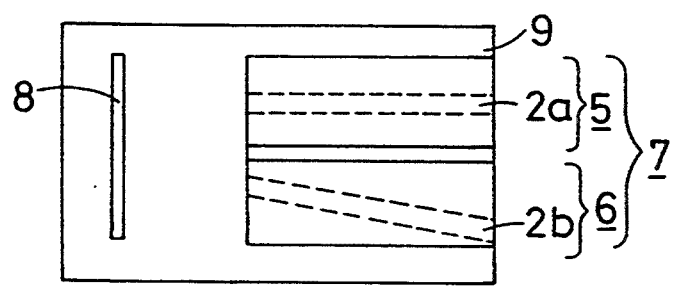
FIG. 9 is a plan view of an optical integrated circuit in accordance with a ninth embodiment of the present invention.
Figure 10:
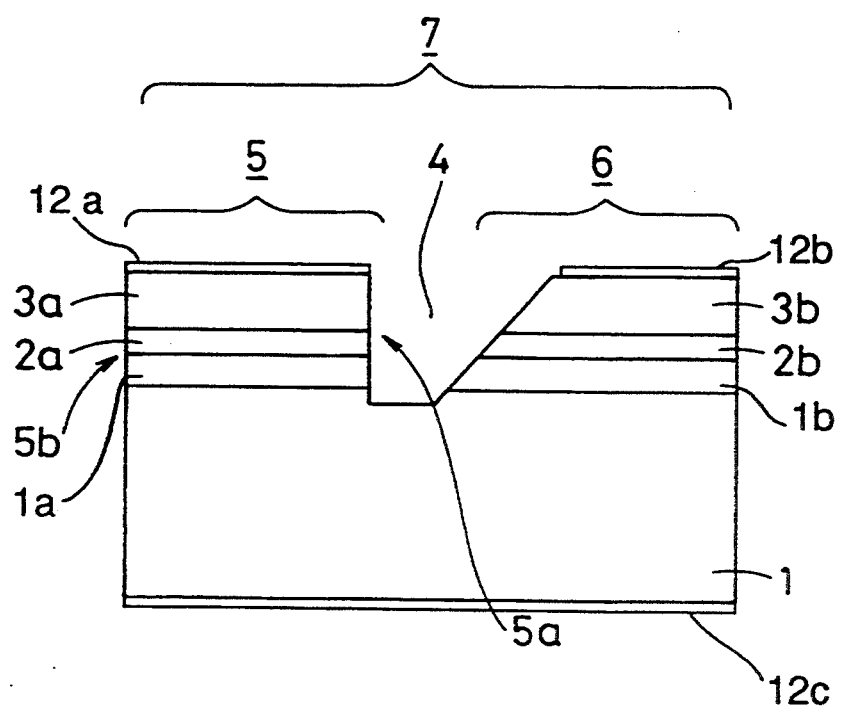
FIG. 10 is a cross-sectional view of an optical integrated circuit in accordance with a prior art.

In the above-described first to eighth embodiments, the optical axes of the laser diode 5 and the photodiode 6 are arranged in parallel. However, these optical axes are not necessarily required to be parallel to each other. In a ninth embodiment shown in FIG. 9, the photodiode 6 is arranged at the side of the laser diode 5, and the optical axes of the active layers 2a and 2b of both are not parallel to each other and but are diagonal to each other.

What is claimed is:

1. An optical integrated circuit comprising:

a semiconductor substrate including a laser diode having an optical axis along which laser light is emitted and a photodiode having an optical axis along which incident light is detected, said laser diode and said photodiode being separated by a groove in said semiconductor substrate, the optical axes of said laser diode and said photodiode being parallel but not collinear;

a supporting plate on which said semiconductor substrate is mounted; and a mirror optically coupling said laser diode with said photodiode and disposed on said supporting plate.

2. The optical integrated circuit of claim 1 wherein said mirror is a plane mirror perpendicular to the optical axis of said laser diode.

3. The optical integrated circuit of claim 1 wherein said mirror is a plane mirror oblique to the optical axis of said laser diode.

4. The optical integrated circuit of claim 1 wherein said mirror is a corner cube prism having three surfaces and arranged such that one of the surfaces of said corner cube prism is perpendicular to the optical axis of said laser diode.

5. The optical integrated circuit of claim 1 wherein said mirror is a spherical mirror having a plane surface and a spherical surface with the plane surface perpendicular to the optical axis of said laser diode.

6. The optical integrated circuit of claim 1 wherein said mirror is a ellipsoidal mirror of revolution having a plane surface and an ellipsoidal surface with the plane surface perpendicular to the optical axis of said laser diode.

7. The optical integrated circuit of claim 1 wherein said reflecting mirror is a rectangular-parallelepiped reflecting mirror adhered to said laser diode and said photodiode.

8. The optical integrated circuit of claim 7 wherein said mirror has a U-shaped configuration and the U-shaped configuration is adhered to said laser diode and said photodiode, respectively.

9. The optical integrated circuit of claim 2 including a low reflectivity film on said photodiode where light from said laser diode is incident.

10. The optical integrated circuit of claim 3 including a low reflectivity film on said photodiode where light from said laser diode is incident.

11. The optical integrated circuit of claim 4 including a low reflectivity film on said photodiode where light from said laser diode is incident.

12. The optical integrated circuit of claim 5 including a low reflectivity film on said photodiode where light from said laser diode is incident.

13. The optical integrated circuit of claim 6 including a low reflectivity film on said photodiode where light from said laser diode is incident.

* * * * *